(12) United States Patent
Liu

(10) Patent No.: US 8,664,714 B2
(45) Date of Patent: Mar. 4, 2014

(54) POWER MOSFET

(75) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 3 days.

(21) Appl. No.: 13/596,081

(22) Filed: Aug. 28, 2012

(65) Prior Publication Data

US 2013/0248986 A1 Sep. 26, 2013

(30) Foreign Application Priority Data

Mar. 22, 2012 (TW) .............................. 101205178 A

(51) Int. Cl.
*H01L 29/66* (2006.01)

(52) U.S. Cl.
USPC .... 257/330; 257/334; 257/335; 257/E21.418; 257/E21.435

(58) Field of Classification Search
None
See application file for complete search history.

(56) References Cited

U.S. PATENT DOCUMENTS

| | | | |
|---|---|---|---|
| 6,462,379 B2 | 10/2002 | Higashi et al. | |
| 6,818,947 B2 | 11/2004 | Grebs et al. | |
| 7,687,352 B2 | 3/2010 | Su et al. | |
| 2004/0185622 A1* | 9/2004 | Williams et al. | 438/270 |
| 2008/0035987 A1* | 2/2008 | Hebert | 257/330 |
| 2008/0179662 A1 | 7/2008 | Hshieh | |
| 2009/0090967 A1* | 4/2009 | Chen et al. | 257/330 |
| 2009/0206913 A1* | 8/2009 | Zeng et al. | 327/534 |
| 2009/0278198 A1* | 11/2009 | Cao et al. | 257/330 |
| 2010/0117145 A1* | 5/2010 | Hshieh | 257/330 |
| 2010/0308370 A1* | 12/2010 | Hshieh | 257/136 |
| 2011/0180844 A1* | 7/2011 | Hsieh | 257/140 |
| 2011/0254086 A1* | 10/2011 | Hsieh | 257/330 |
| 2011/0291185 A1* | 12/2011 | Grover | 257/334 |
| 2011/0316075 A1* | 12/2011 | Hsieh | 257/330 |
| 2012/0037954 A1* | 2/2012 | Hshieh | 257/139 |
| 2012/0193748 A1* | 8/2012 | Yedinak et al. | 257/488 |
| 2013/0069145 A1* | 3/2013 | Kawano et al. | 257/330 |
| 2013/0075810 A1* | 3/2013 | Hsieh | 257/328 |
| 2013/0168761 A1* | 7/2013 | Hsieh | 257/330 |
| 2013/0168765 A1* | 7/2013 | Lin et al. | 257/334 |

* cited by examiner

*Primary Examiner* — Julio J. Maldonado
*Assistant Examiner* — Harpreet Singh
(74) *Attorney, Agent, or Firm* — Jianq Chyun IP Office

(57) ABSTRACT

A power MOSFET includes an epitaxy substrate, conductive trenches, well regions and a dielectric layer. The power MOSFET further has at least one termination structure including at lest one of the conductive trenches, some of the well regions within a termination area and mutually insulated by the conductive trench, a field plate, a contact plug and a heavily-doped region. The field plate including a plate metal and the dielectric layer is on the well regions and the conductive trench within the termination area. The contact plug penetrates through the dielectric layer and connects the plate metal and one of the well regions, so the plate metal has equal potential with the connected well region through the contact plug. The well regions and the conductive trench are electrically coupled to the plate metal by the dielectric layer. The heavily-doped region is between the contact plug and the connected well region.

19 Claims, 6 Drawing Sheets

POWER MOSFET

CROSS-REFERENCE TO RELATED APPLICATION

This application claims the priority benefit of Taiwan application serial no. 101205178, filed on Mar. 22, 2012. The entirety of the above-mentioned patent application is hereby incorporated by reference herein and made a part of this specification.

BACKGROUND OF THE INVENTION

1. Field of Invention

The present invention relates to a power metal-oxide-semiconductor field effect transistor (MOSFET), and more generally to a power MOSFET with improved breakdown voltage.

2. Description of Related Art

Power MOSFETs are mainly applied to power switching devices. For example, a power MOSFET serving as a power on/off switch is provided in various power management apparatuses.

Generally, in order to maintain the breakdown voltage in the termination area 100 around devices in the active area of a power MOSFET, a plurality of floating trench rings 102 is disposed within the termination area 100, as shown in FIG. 1. Similar concepts have been disclosed in U.S. Pat. No. 6,462,379 and U.S. publication number 2008/0179662.

However, as the level of integration for power MOSFETs continues to increase, the dimension thereof is accordingly decreased. Therefore, how to maintain or even increase the original breakdown voltage when the device is scaled down has become one of the main topics in the industry.

SUMMARY OF THE INVENTION

The present invention provides a power MOSFET with a higher breakdown voltage.

The present invention further provides a power MOSFET capable of reducing the size of a termination area in the power MOSFET.

A power MOSFET having an active area, a gate bus area and a termination area is introduced herein. The power MOSFET comprises an epitaxy substrate, a plurality of conductive trenches located in the epitaxy substrate, a plurality of well regions disposed within the epitaxy substrate, and a dielectric layer disposed on surfaces of the plurality of conductive trenches. The power MOSFET further comprises at least one termination structure including at least one of the conductive trenches, the well regions disposed within the termination area and electrically isolated from each other by the conductive trenches, a field plate, a contact plug and a heavily-doped region. The field plate is disposed on the well regions and the at least one of the conductive trenches within the termination area, and it includes a plate metal and the dielectric layer. The contact plug penetrates through the dielectric layer and connects the plate metal and one of the well regions within the termination area, so that the plate metal has an equal electric potential with the connected well region through the contact plug, and the well regions and the at least one of the conductive trenches are electrically coupled to the plate metal by the dielectric layer. The heavily-doped region is sandwiched in between the contact plug and the connected well region.

According to an embodiment of the present invention, the epitaxy substrate is an N-type substrate, the well regions are P-type well regions and the heavily-doped region is a P+ region.

According to an embodiment of the present invention, the epitaxy substrate is a P-type substrate, the well regions are N-type well regions and the heavily-doped region is an N+ region.

According to an embodiment of the present invention, the well region connected to the contact plug is disposed across the termination area, the gate bus area and the active area.

According to an embodiment of the present invention, electric potentials of the well regions of the termination structure are decreased toward the active area and increased away from the active area.

According to an embodiment of the present invention, the well region connected to the contact plug has the lowest electric potential among the well regions of the termination structure.

According to an embodiment of the present invention, the number of the at least one termination structure is greater than 1.

According to an embodiment of the present invention, the power MOSFET further includes a seal ring area surrounding the at least one termination structure.

According to an embodiment of the present invention, the conductive trenches located in the epitaxy substrate may be disposed between the at least one terminal structure and the gate bus area.

According to an embodiment of the present invention, the conductive trenches located in the epitaxy substrate may be disposed outside of the at least one terminal structure.

According to an embodiment of the present invention, the power MOSFET further includes a plurality of doped regions disposed respectively between the well regions and the dielectric layer, wherein the doped regions within the active area serve as source regions.

A power MOSFET having an active area, a gate bus area and a termination area is further introduced herein. The power MOSFET comprises an epitaxy substrate, a plurality of conductive trenches located in the epitaxy substrate, a plurality of well regions disposed within the epitaxy substrate, and a dielectric layer disposed on surfaces of the plurality of conductive trenches. The power MOSFET further includes a first termination structure and at least one second termination structure. The first termination structure includes a trench gate located within the gate bus area, at least one of the conductive trenches beside the trench gate, the well regions electrically isolated by the at least one of the conductive trenches, a first field plate and a first contact plug. The first field plate is disposed on the trench gate, the conductive trench and the well regions within the gate bus area, and it includes a first plate metal and the dielectric layer. The first contact plug penetrates through the dielectric layer and connects the first plate metal and the trench gate, so that the first plate metal has an equal electric potential with the trench gate through the first contact plug. The well regions and the first conductive trench within the gate bus area are electrically coupled to the first plate metal by the dielectric layer. The second termination structure includes at least one of the conductive trenches, a plurality of the well regions electrically isolated by the at least one of the conductive trenches within the termination area, a second field plate, a second contact plug and a heavily-doped region. The second field plate is disposed on the well regions which are not covered by the first plate metal and on the conductive trenches within the termination area. The second field plate includes a second plate metal and the dielectric layer. The second contact plug penetrates through the dielectric layer and connects the second plate metal and one of the well regions within the termination area, so that the second plate metal has an equal electric potential with the connected well region through the second contact plug. The heavily-doped region is disposed between the second contact plug and the connected well region.

According to an embodiment of the present invention, the epitaxy substrate is an N-type substrate, the well regions are P-type well regions and the heavily-doped region is a P+ region.

According to an embodiment of the present invention, the epitaxy substrate is a P-type substrate, the well regions are N-type well regions and the heavily-doped region is an N+ region.

According to an embodiment of the present invention, electric potentials of the well regions of the second termination structure are decreased toward the active area and increased away from the active area.

According to an embodiment of the present invention, the well region connected to the second contact plug has the lowest electric potential among the well regions of the second termination structure.

According to an embodiment of the present invention, the number of the at least one second termination structure is greater than 1.

According to an embodiment of the present invention, the power MOSFET further includes a plurality of doped regions disposed respectively between the well regions and the dielectric layer, wherein the doped regions within the active area serve as source regions.

According to an embodiment of the present invention, the power MOSFET further includes a seal ring area surrounding the first termination structure and the at least one termination structure.

In view of the above, in the power MOSFET of the present invention, a capacitor is formed by the dielectric layer, the low-potential field plate in the termination area and each of the underlying floating conductive trenches and well regions. Therefore, the depletion region of the well regions is increased, and the breakdown voltage is further enhanced. Besides, in the power MOSFET of the present invention, the termination structure may be integrated with the trench gate of the gate bus area, so as to reduce the size of the termination area of the device.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
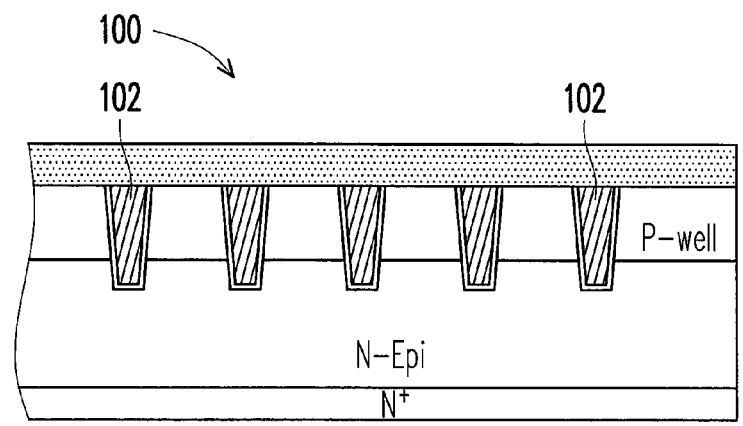
FIG. 1 is a schematic view of a termination area of a conventional power MOSFET.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
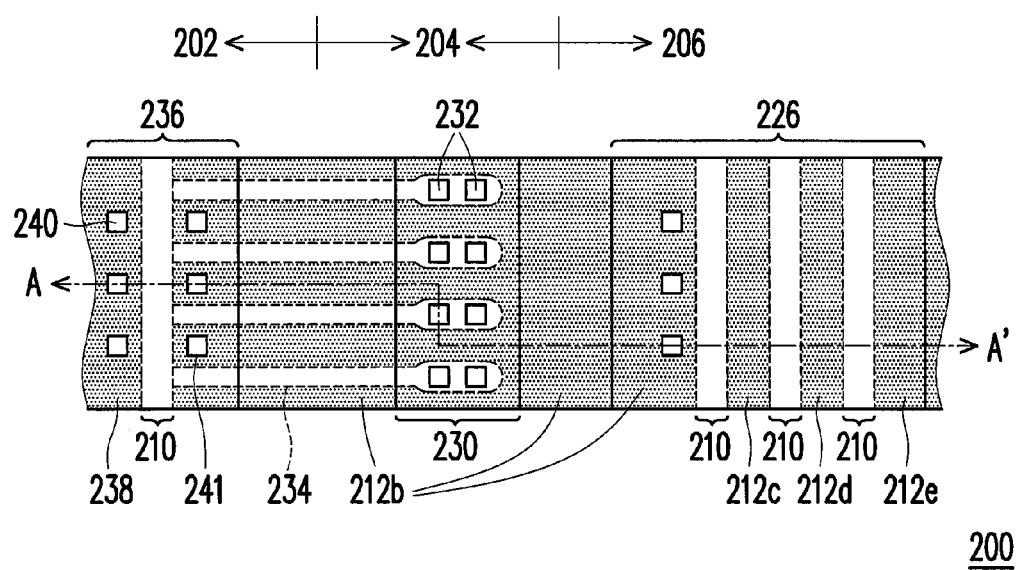
FIG. 2A is a partial top view illustrating a power MOSFET according to a first embodiment of the present invention.
Figure 2B:
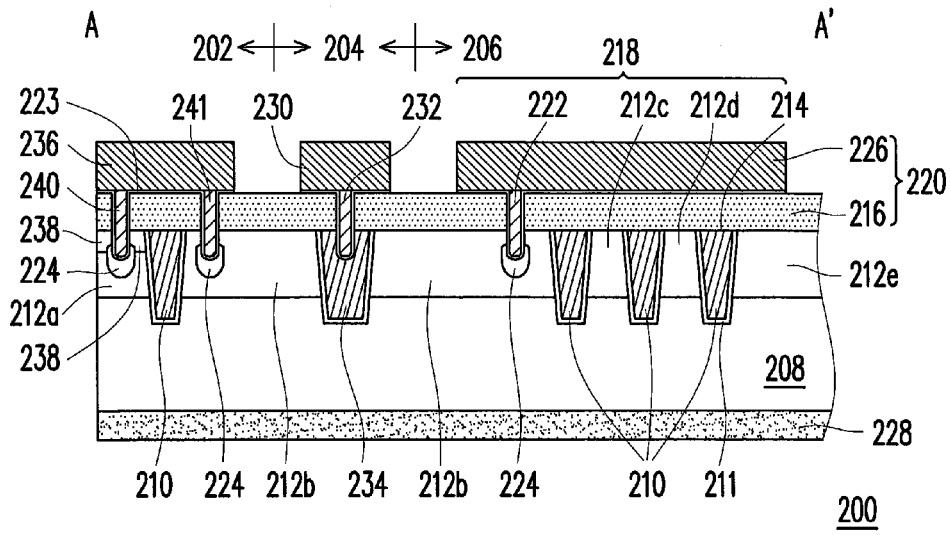
FIG. 2B is a schematic cross-sectional view taken along the line A-A' of FIG. 2A.

FIG. 2A is a partial top view illustrating a power MOSFET according to a first embodiment of the present invention. FIG. 2B is a schematic cross-sectional view taken along the line A-A' of FIG. 2A.

Referring to FIG. 2A, the power MOSFET 200 of the first embodiment has an active area 202, a gate bus area 204 and a termination area 206. The active area 202 is generally disposed in the center of the whole power MOSFET 200, the gate bus area 204 is at the side of the active area 202, and the termination area 206 is disposed surrounding the active area 202 and the gate bus area 204. In the first embodiment, only a portion of the components are shown in the drawings, other components may be inferred from known art and are omitted herein.

In FIGS. 2A-2B, the power MOSFET 200 includes an epitaxy substrate 208, a plurality of conductive trenches 210 located in the epitaxy substrate 208, a plurality of well regions 212a-212e disposed within the epitaxy substrate 208, and a dielectric layer 216 disposed on the surfaces 214 of the trenches 210. Each conductive trench 210, for example, includes an oxide layer 211 and a polysilicon layer (or a metal layer) filling in the trench, but it is not limited thereto.

The power MOSFET 200 of the first embodiment further has a termination structure 218. The termination structure 218 includes the conductive trenches 210 located within the termination area 206, the well regions 210b-210e disposed within the termination area 206 and electrically isolated from each other by the conductive trenches 210, a field plate 220, a contact plug 222 and a heavily-doped region 224. The field plate 220 is disposed on the conductive trenches 210 and on the well regions 210b-210e in the termination area 206. The field plate 220 includes a plate metal 226 (e.g. Al, AlCu alloy, AlCu, AlCuSi, Ni/Ag, Al/NiAu, AlCu/NiAu, AlCuSi/NiAu etc.) and the dielectric layer 216 (e.g. oxide). The contact plug 222 penetrates through the dielectric layers 216 and connects the plate metal 226 and the well region 212b, so that the plate metal 226 has an equal electric potential with the well region 212b through the contact plug 222. The heavily-doped region 224 is disposed between the contact plug 222 and the connected region 212b. Further, a barrier layer 223 (e.g. Ti/TiN) is usually disposed below the field plate 220 and below the contact plug 222.

When the epitaxy substrate 208 is an N-type substrate, the well regions 210a-210e are P-type well regions, and the heavily-doped region 224 is a P+ region. In such case, an N+ drain 228 is formed in the backside of the epitaxy substrate 208. On the contrary, when the epitaxy substrate 208 is a P-type substrate, the well regions 210a-210e are N-type well regions, and the heavily-doped region 224 is an N+ region. In such case, a P+ drain 228 is formed in the backside of the epitaxy substrate 208. The gate bus area 204 has a gate metal 230, a gate plug 232 and a conductive trench 234 as a trench gate.

In the well regions 210a-210e, the well region 212a is located in the active area 202; the well region 212b is located in the termination area 206, in the gate bus area 204 and in the active area 202; and the well regions 212c-212e are located in the termination area 206 and electrically isolated from each other. Their electric potentials satisfy the following relationship: V(212a)=V(212b)<V(212c)<V(212d)<V(212e). That is, electric potentials of the well regions are decreased toward the active area 202; or electric potentials of the well regions are increased away from the active area 202. Therefore, the well region 212b connected to the contact plug 222 has the lowest electric potential among the well regions 212b-212e of the termination structure 218. The gate bus area 204 has a gate metal 230, a gate plug 232 and a trench gate 234. The trench gate 234 may be a structure including an oxide layer 211 and a polysilicon layer or a metal layer filling in the trench, but the present invention is not limited thereto.

In addition, components such as a source metal 236, a source region 238, a source plug 240 and a contact 241 are further shown in the active area 202 of FIG. 2A and FIG. 2B. The well region 212b has an equal electric potential with the source metal 236 through the contact 241 in the well region 212b. The plate metal 226 has an equal electric potential with the well region 212b through the contact plug 222 in the well region 212b. Accordingly, the well region 212b, the source metal 236 and the plate metal 226 are equipotential.

Figure 3:
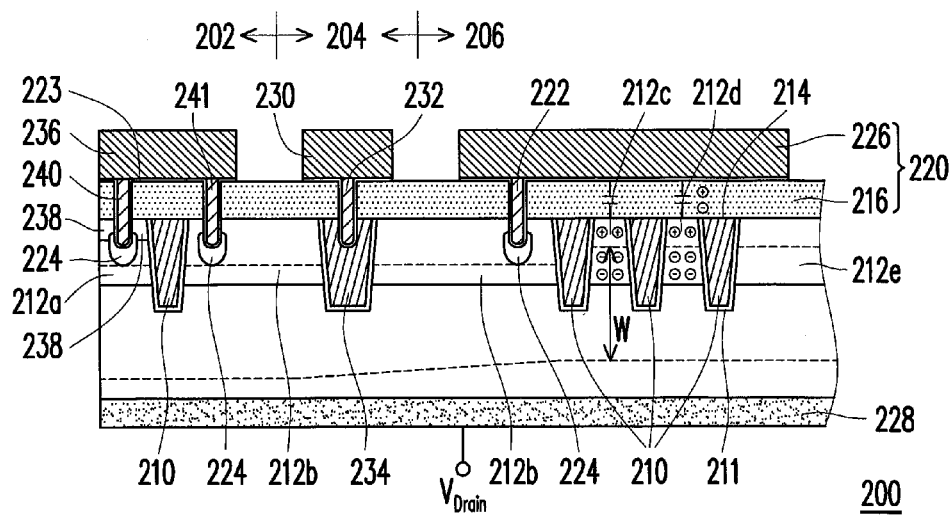
FIG. 3 is the position of the depletion region in FIG. 2B.

In the case that the drain voltage $V_{Drain}=V_R>0V$ and the source voltage of the active area 202 is grounded (GND), the plate metal 226 and the source metal 236 are equipotential and each of the well regions 212c-212e and the conductive trenches 210 in the termination structure 218 is floating, so that a capacitor is formed by the dielectric layer 216, the plate metal 226 and each of the well regions 212c-212e and the conductive trenches 210, as shown in FIG. 3. In other words, the well regions 212c-212e and the conductive trenches 210 are electrically coupled to the plate metal 226 by the dielectric layer 216.

In FIG. 3, since capacitances are formed within the dielectric layer 216, Coulomb force effect causes the holes in the well regions 212c-212e to move toward the surface thereof, and the depletion region of the well regions 212c-212e thereby moves upwardly (the borderline of the depletion region is marked as dotted lines in FIG. 3). Therefore, the width W of the depletion region within the termination area 206 is increased. According to the following formula, when the width W of the depletion region is increased, $V_R$ is increased and the breakdown voltage is thereby enhanced.

$$W = \left\{ \frac{2\varepsilon_S(V_{bi}+V_R)}{e}\left[\frac{N_a+N_d}{N_aN_d}\right]\right\}^{1/2}$$

In the above formula, $\varepsilon_s$ represents the semiconductor permittivity, e represents the electronic charge, $V_{bi}$ represents the built-in potential barrier, and $V_R$ represents the reverse-bias. $N_a$ represents the dopant concentration of the well regions 212a-212e. $N_d$ represents the dopant concentration of the epitaxy substrate 208.

Figure 4:
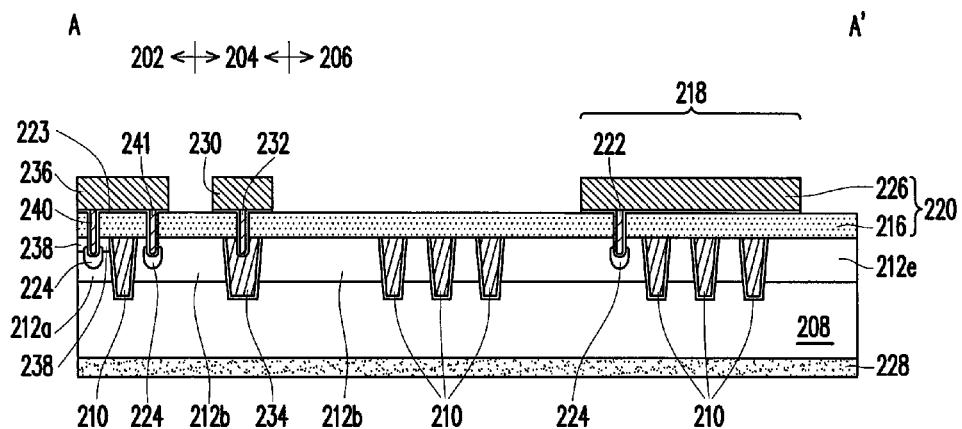
FIG. 4, FIG. 5 and FIG. 6 are three modified embodiments of FIG. 2B.
Figure 5:
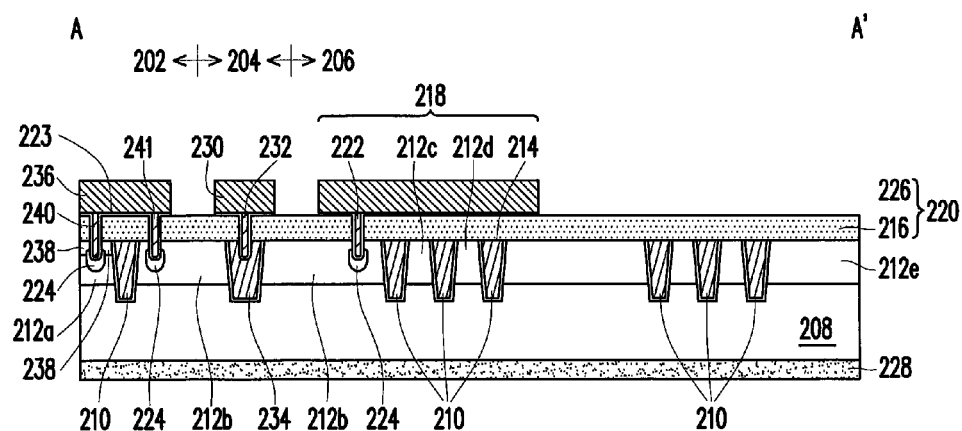
Figure 6:
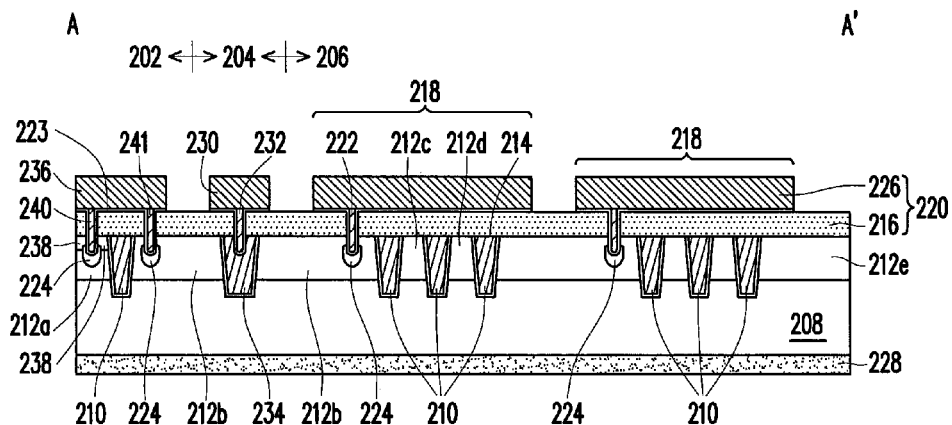

FIG. 4, FIG. 5 and FIG. 6 are three modified embodiments of FIG. 2B, wherein the same reference numerals indicate the same components in FIGS. 4-6 and FIG. 2B.

Referring to FIG. 4, in the termination area 206, the conductive trenches 210 is covered by the plate metal 226 and disposed in the epitaxy substrate 208 between the termination structure 218 and the gate bus area 204.

Referring to FIG. 5, in the termination area 206, the conductive trenches 210 is covered by the plate metal 226 and disposed in the epitaxy substrate 208 outside of the termination structure 218.

In FIG. 6, the number of the termination structures 218 is two, but it is not limited thereto. The number of the termination structures 218 may be increased upon the device design requirements.

Figure 7:
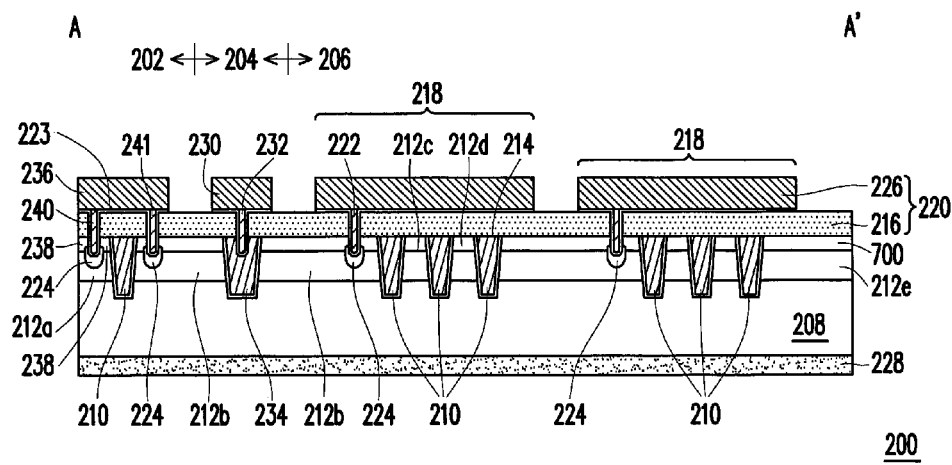
FIG. 7 is a modified embodiment of FIG. 6.

FIG. 7 is a modified embodiment of FIG. 6, wherein the same reference numerals indicate the same components in FIG. 6 and FIG. 7. A plurality of doped regions 700 is further shown in FIG. 7 as compared to FIG. 6, and the doped regions 700 are disposed respectively between the well regions 212a-212e and the dielectric layer 216. When the well regions 212a-212e are P-type well regions, the doped regions 700 are N+ doped regions, and vice versa. Further, the doped regions 700 in the active area 202 may actually serve as source regions, so that one mask process may be omitted during the formation of the structure in FIG. 7.

Figure 8:
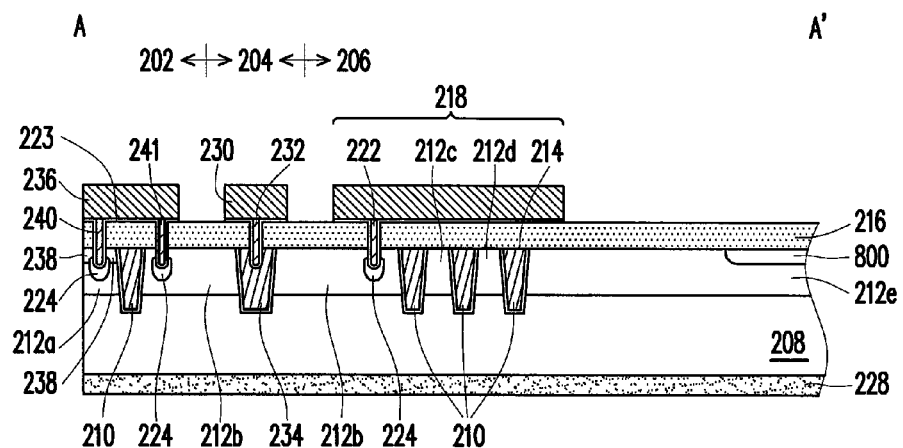
FIG. 8 is another modified embodiment of FIG. 2B.

FIG. 8 is another modified embodiment of FIG. 2B, wherein the same reference numerals indicate the same components in FIG. 8 and FIG. 2B. In FIG. 8, the power MOSFET further includes a seal ring area 800 surrounding the termination structure 218. For example, when the well region 212e is a P-type well region, the seal ring area 800 is N+ region. Besides, if necessary, the seal ring area 800 may be disposed in other embodiments.

FIG. 9A to FIG. 9D are schematic views of various seal ring areas of FIG. 8.

Figures 9A, 9B, 9C, 9D:
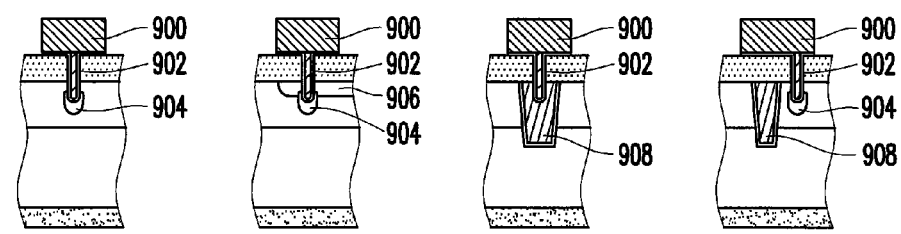
FIG. 9A to FIG. 9D are schematic views of various seal ring areas of FIG. 8.

In FIG. 9A, the seal ring area includes a conductive seal ring 900, a seal ring plug 902 and a heavily-doped region 904.

In FIG. 9B, the seal ring area includes a conductive seal ring 900, a seal ring plug 902, a heavily-doped region 904 and an N+ region 906.

In FIG. 9C, the seal ring area includes a conductive seal ring 900, a seal ring plug 902 and a conductive trench 908, wherein the seal ring plug 902 is connected to the conductive trench 908.

In FIG. 9D, the seal ring area includes a conductive seal ring 900, a seal ring plug 902, a heavily-doped region 904 and a conductive trench 908, wherein the seal ring plug 902 does not contact the conductive trench 908.

Figure 10:
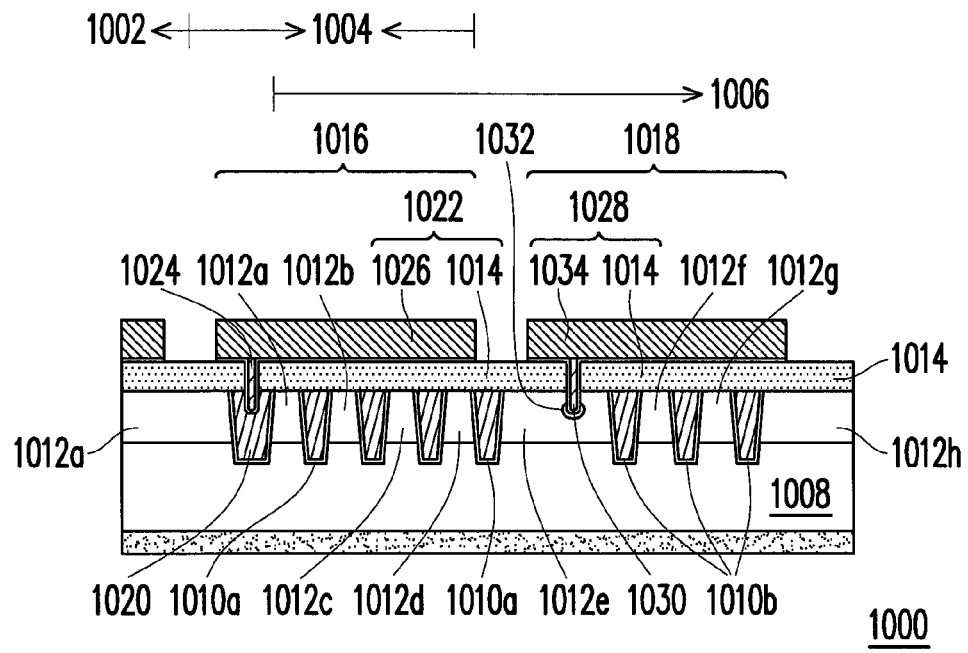
FIG. 10 is a schematic cross-sectional view illustrating a power MOSFET according to a second embodiment of the present invention.

FIG. 10 is a schematic cross-sectional view illustrating a power MOSFET according to a second embodiment of the present invention.

Referring to FIG. 10, similar to the case of the first embodiment, the power MOSFET 1000 of the second embodiment has an active area 1002, a gate bus area 1004 and a termination area 1006. Also, please refer to the first embodiment for the components omitted in the active area 1002. The power MOSFET 1000 includes a epitaxy substrate 1008, a plurality of conductive trenches 1010a-1010b located in the epitaxy substrate 1008, a plurality of well regions 1012a-1012h disposed within the epitaxy substrate 1008, and a dielectric layer 1014 disposed on the surfaces of the conductive trenches 1010a-1010b. The power MOSFET 1000 further includes a first termination structure 1016 and at least one second termination structure 1018.

The first termination structure 1016 includes a trench gate 1020 located within the gate bus area 1004, the conductive trenches 1010a beside the trench gate 1020, the well regions 1012a-1012d electrically isolated from each other by the conductive trenches 1010a, a first field plate 1022 and a first contact plug 1024. The first field plate 1022 is disposed on the trench gate 1020, on the conductive trenches 1010a and on the well regions 1012a-1012d. The first field plate 1022 includes a first plate metal 1026 and the dielectric layer 1014. The first contact plug 1024 penetrates through the dielectric layer 1014 and connects the first plate metal 1026 and the trench gate 1020, so that the first plate metal 1026 has an equal electric potential with the trench gate 1020 through the first contact plug 1024.

Since the trench gate 1020 in the gate bus area 1004 is grounded (GND) when the devices are OFF, the first plate metal 1026 is still at ground potential. Therefore, a capacitor is formed by the dielectric layer 1014, the first plate metal 1026 and each of the well regions 1012a-1012d and the conductive trenches 1010a, so as to enhance the breakdown voltage. As for other elements, please refer to corresponding parts described in above figures, and the details are not iterated herein.

The second termination structure 1018 includes the conductive trenches 1010b located within the termination area 1006, the well regions 1012e-1012h disposed within the termination area 1006 and electrically isolated from each other by the conductive trenches 1010b, a second field plate 1028, a second contact plug 1030 and a heavily-doped region 1032. The second field plate 1028 is disposed on the conductive trenches 1010b and on the well regions 1012e-1012h in the termination area 1006. The second field plate 1028 includes a second metal plate 1034 and the dielectric layer 1014. The second contact plug 1030 penetrates through the dielectric layer 1014 and connects the second plate metal 1034 and the well region 1012e, so that the second plate metal 1034 has an equal electric potential with the well region 1012e through the second contact plug 1030. The heavily-doped region 1032 is disposed between the second contact plug 1030 and the connected well region 1012e.

When the epitaxy substrate 1008 is an N-type substrate, the well regions 1012a-1012h are P-type well regions, and the heavily-doped region 1032 is a P+ region. On the contrary, when the epitaxy substrate 1008 is a P-type substrate, the well regions 1012a-1012h are N-type well regions, and the heavily-doped region 1032 is an N+ region.

In the well regions 1012a-1012h, the well region 1012a is located across the termination area 1006, the gate bus area 1004 and the active area 1002; and the well regions 1012b-1012h are located in the termination area 1006 and electrically isolated from each other. Their electric potentials satisfy the following relationship: $V(1012a) < V(1012b) < V(1012c) < V(1012d) < V(1012e) < V(1012f) < V(1012g) < V(1012h)$. That is, electric potentials of the well regions are decreased toward the active area 1002; or electric potentials of the well regions are increased away from the active area 1002. Therefore, the second termination structure 1018 of the second embodiment is similar to the termination structure 218 of the first embodiment, and the well region 1012e connected to the second contact plug 1030 has the lowest electric potential among the well regions 1012e-1012h of the second termination structure 1018. Besides, only one second termination structure 1018 is shown in FIG. 10, but it is not limited thereto. The number of the second termination structures 1018 may be increased upon the device design requirements.

Figure 11:
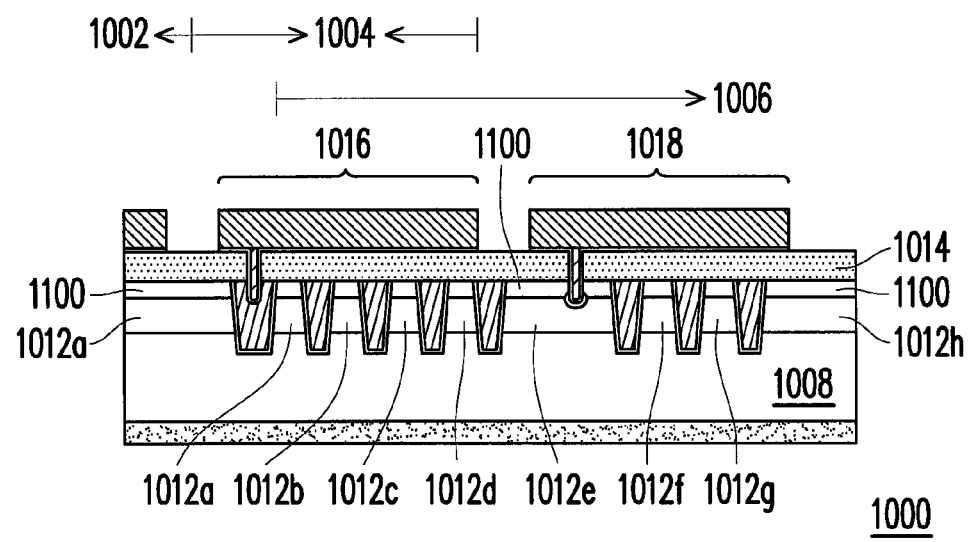
FIG. 11 is a modified embodiment of FIG. 10.

FIG. 11 is a modified embodiment of FIG. 10, wherein the same reference numerals indicate the same components in FIG. 11 and FIG. 10. A plurality of doped regions 1100 is further shown in FIG. 11 as compared to FIG. 10, and the doped regions 1100 are disposed respectively between the well regions 1012a-1012h and the dielectric layer 1014. The doped regions 1100 may be formed simultaneously during the step of forming the source regions within the active area 1002. Therefore, in the process of forming the structure of FIG. 11, it is not necessary to perform an additional photomask process to shield the areas outside of the active area 1002.

In summary, according to the structural design of the present invention, a capacitor is formed by the dielectric layer, the field plate and each of the underlying floating conductive trenches and well regions. Therefore, the depletion region of the well regions is increased, and the breakdown voltage is further enhanced. Besides, the reduction in the size of the termination area is also observed.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A power MOSFET, having an active area, a gate bus area and a termination area, the power MOSFET comprising:
    an epitaxy substrate;
    a plurality of conductive trenches, located in the epitaxy substrate;
    a plurality of well regions, disposed within the epitaxy substrate;
    a dielectric layer, disposed on surfaces of the plurality of conductive trenches; and
    at least one termination structure within the termination area, the termination structure comprising:
        at least one of the plurality of conductive trenches;
        the plurality of well regions within the termination area and electrically isolated from each other by the at least one of the conductive trenches;
        a field plate, disposed on the well regions and on the at least one of the conductive trenches within the termination area, wherein the field plate comprises a plate metal and the dielectric layer;
        a contact plug, penetrating through the dielectric layer and connecting the plate metal and one of the well regions, so that the plate metal has an equal electric potential with the connected well region through the contact plug, and the well regions and the at least one of the conductive trenches are electrically coupled to the plate metal by the dielectric layer; and
        a heavily-doped region, disposed between the contact plug and the connected well region.

2. The power MOSFET of claim 1, wherein the epitaxy substrate is an N-type substrate, the well regions are P-type well regions and the heavily-doped region is a P+ region.

3. The power MOSFET of claim 1, wherein the epitaxy substrate is a P-type substrate, the well regions are N-type well regions and the heavily-doped region is an N+ region.

4. The power MOSFET of claim 1, wherein the well region connected to the contact plug is disposed across the termination area, the gate bus area and the active area.

5. The power MOSFET of claim 1, wherein electric potentials of the well regions of the termination structure are decreased toward the active area and increased away from the active area.

6. The power MOSFET of claim 5, wherein the well region connected to the contact plug has a lowest electric potential among the well regions of the termination structure.

7. The power MOSFET of claim 1, wherein a number of the at least one termination structure is greater than 1.

8. The power MOSFET of claim 1, further comprising a seal ring area surrounding the at least one termination structure.

9. The power MOSFET of claim 1, wherein at least one of the conductive trenches is disposed in the epitaxy substrate between the at least one terminal structure and the gate bus area.

10. The power MOSFET of claim 1, wherein at least one of the conductive trenches is disposed in the epitaxy substrate outside of the at least one terminal structure.

11. The power MOSFET of claim 1, further comprising a plurality of doped regions disposed respectively between the well regions and the dielectric layer, wherein the doped regions within the active area serve as source regions.

12. A power MOSFET, having an active area, a gate bus area and a termination area, the power MOSFET comprising:
an epitaxy substrate;
a plurality of conductive trenches, located in the epitaxy substrate;
a plurality of well regions, disposed within the epitaxy substrate;
a dielectric layer, disposed on surfaces of the plurality of conductive trenches;
a first termination structure within the termination area, the first termination structure comprising:
a trench gate, located within the gate bus area;
at least one of the plurality of conductive trenches, located beside the trench gate;
the plurality of well regions, electrically isolated from each other by the first conductive trench;
a first field plate, disposed on the trench gate, the at least one of the conductive trenches, and the well regions, wherein the first field plate comprises a first plate metal and the dielectric layer; and
a first contact plug, penetrating the dielectric layer and connecting the first plate metal and the trench gate, so that the first plate metal has an equal electric potential with the trench gate through the first contact plug, and the well regions and the least one of the conductive trenches are electrically coupled to the first plate metal by the dielectric layer; and
at least one second termination structure within the termination area, the second termination structure comprising:
at least one of the plurality of conductive trenches;
the plurality of well regions, disposed within the termination area and electrically isolated from each other by the at least one of the conductive trenches;
a second field plate, disposed on the well regions and the at least one of the conductive trenches, wherein the second field plate is not covered by the first plate metal and comprises a second plate metal and the dielectric layer;
a second contact plug, penetrating through the dielectric layer and connecting the second plate metal and one of the well regions, so that the second plate metal has an equal electric potential with the connected well region through the second contact plug; and
a heavily-doped region, disposed between the second contact plug and the connected well region.

13. The power MOSFET of claim 12, wherein the epitaxy substrate is an N-type substrate, the well regions are P-type well regions and the heavily-doped region is a P+ region.

14. The power MOSFET of claim 12, wherein the epitaxy substrate is a P-type substrate, the well regions are N-type well regions and the heavily-doped region is an N+ region.

15. The power MOSFET of claim 12, wherein electric potentials of the well regions of the second termination structure are decreased toward the active area and increased away from the active area.

16. The power MOSFET of claim 15, wherein the well region connected to the second contact plug has a lowest electric potential among the well regions of the second termination structure.

17. The power MOSFET of claim 12, wherein a number of the at least one second termination structure is greater than 1.

18. The power MOSFET of claim 12, further comprising a plurality of doped regions disposed respectively between the well regions and the dielectric layer, wherein the doped regions within the active area serve as source regions.

19. The power MOSFET of claim 12, further comprising a seal ring area surrounding the first termination structure and the at least one termination structure.

* * * * *